United States Patent
Hermann (10) Patent No.: US 8,193,955 B2
(45) Date of Patent: Jun. 5, 2012

(54) MODULAR UNITS FOR SYNCHRO-TO-DIGITAL CONVERSION AND DIGITAL-TO-SYNCHRO CONVERSION

(75) Inventor: Charles J. Hermann, Westville, NJ (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 81 days.

(21) Appl. No.: 12/916,020

(22) Filed: Oct. 29, 2010

(65) Prior Publication Data

US 2011/0037627 A1    Feb. 17, 2011

Related U.S. Application Data

(60) Provisional application No. 61/257,629, filed on Nov. 3, 2009.

(51) Int. Cl.
*H03M 1/48* (2006.01)
(52) U.S. Cl. .......................... 341/116; 341/111
(58) Field of Classification Search .................. 341/116, 341/111, 112, 113, 114, 115, 117; 318/652, 318/653, 654, 655, 656, 661; 702/142, 150, 702/151
See application file for complete search history.

(56) References Cited

U.S. PATENT DOCUMENTS 4,703,307 A * 10/1987 James et al. .................. 341/117

* cited by examiner

*Primary Examiner* — Joseph Lauture
(74) *Attorney, Agent, or Firm* — Howard Kaiser (57) ABSTRACT

The inventive data conversion device is typically embodied as a modular unit including a PCBA and a frame that houses it. The PCBA includes a PCB and electronic components mounted thereon including a computer and one or more conventional conversion devices, viz., at least one conventional synchro-to-digital converter and/or at least one conventional digital-to-synchro converter. According to typical inventive synchro-to-digital conversion, analog synchro data (received from a synchro) is converted by the synchro-to-digital converter(s) to lower-level-format parallel-binary-angle digital synchro data, which in turn is converted by the computer to higher-level-format digital synchro data. According to typical inventive digital-to-synchro conversion, higher-level-format digital synchro data (received from a modern-day digital device/system/network) is converted by the computer to lower-level-format parallel-binary-angle digital synchro data, which in turn is converted by the digital-to-synchro converter(s) to analog synchro data.

18 Claims, 12 Drawing Sheets

MODULAR UNITS FOR SYNCHRO-TO-DIGITAL CONVERSION AND DIGITAL-TO-SYNCHRO CONVERSION

CROSS REFERENCE TO RELATED APPLICATIONS

This application claims the benefit of U.S. provisional application No. 61/257,629, filed 3 Nov. 2009, hereby incorporated herein by reference, entitled "Synchro System Module Synchro-to-Digital 60 Hz (SSM-SD60) Synchro System Module Digital-to-Synchro 60 HZ (SSM-DS60)," sole inventor Charles J. Hermann.

BACKGROUND OF THE INVENTION

The present invention relates to synchros, more particularly to methods and apparatuses for converting a synchro's analog signals to digital signals, or vice versa.

Synchros are analog electronic devices that have been used for many years, primarily in military contexts, for providing angular, positional, and other information pertaining to navigation, communication, detection, weaponry, etc. Examples of information provided by synchros are changes in course, speed, and range of targets or missiles, and angular displacement (position) of a ship's rudder. The noun "synchro" derives from the adjective "synchronous." The synchro was originally developed during the Second World War to synchronize movements of a gun turret with those of a control dial. Generally speaking, synchros look like electric motors (insofar as including a rotor, a stator, and a shaft) and operate like rotary electrical transformers.

Literature instructive on synchros includes, for instance, the *Synchro/Resolver Conversion Handbook*, Fourth Edition, 1994, Library of Congress Catalog Number 74-77038, Data Device Corporation (DDC), 105 Wilbur Place, Bohemia, N.Y. (electronic version, 125 pages, available in pdf at DDC website: http://www.ddc-web.com).

Synchro-to-digital conversion—that is, conversion of synchro (analog) signals to digital signals—is necessary in order for computer technology to make use of analog signals transmitted by synchros, which represent older technology. Conventional practice, such as onboard United States Navy ships, has involved interfacing of synchro-based systems with modern computer-based controls through implementation of centralized computer units. However, the computer systems utilized for such purposes are large and expensive and do not permit direct interfacing of synchros with common smaller-scale digital equipment such as programmable logic controllers (PLCs) or embedded devices, or with popular networking protocols such as DeviceNet.

The following United States patents, each of which is hereby incorporated herein by reference, are of interest with regard to conversion between synchro data and digital data: Goode, III et al. U.S. Pat. No. 6,222,469 B1 issued 24 Apr. 2001; Nealy et al. U.S. Pat. No. 6,172,627 B1 issued 9 Jan. 2001; Gwin U.S. Pat. No. 6,069,576 issued 30 May 2000; Woodland et al. U.S. Pat. No. 5,646,496 issued 8 Jul. 1997; Howard et al. U.S. Pat. No. 5,173,696 issued 22 Dec. 1992; Deppe et al. U.S. Pat. No. 5,034,743 issued 23 Jul. 1991; Hermansdorfer et al. U.S. Pat. No. 4,430,640 issued 7 Feb. 1984; Hermansdorfer et al. U.S. Pat. No. 4,401,932 issued 30 Aug. 1983; Simon et al. U.S. Pat. No. 4,281,316 issued 28 Jul. 1981; Stack et al. U.S. Pat. No. 4,375,636 issued 1 Mar. 1983; Chasson et al. U.S. Pat. No. 4,216,466 issued 5 Aug. 1980; Simon et al. U.S. Pat. No. 4,164,729 issued 14 Aug. 1979; Freed et al. U.S. Pat. No. 4,062,005 issued 6 Dec. 1977; Aramaki U.S. Pat. No. 4,017,846 issued 12 Apr. 1977; Games et al. U.S. Pat. No. 3,997,893 issued 14 Dec. 1976; Griffin U.S. Pat. No. 3,993,993 issued 23 Nov. 1976; Domchick et al. U.S. Pat. No. 3,618,073 issued 2 Nov. 1971.

SUMMARY OF THE INVENTION

In view of the foregoing, it is an object of the present invention to provide a compact unitary device that is capable of interfacing between a synchro and a small-scale computer (e.g., a PLC computer or an embedded computer) so that the device accepts input of analog information from the synchro, converts the analog information to digital information suitable for the small-scale computer, and outputs the digital information for transmission to the small-scale computer.

A further object of the present invention to provide a compact unitary device that is capable of interfacing between a synchro and a network (which implements a present-day-standard communication protocol, e.g., DeviceNet) so that the device accepts input of analog information from the synchro, converts the analog information to digital information suitable for the network, and outputs the digital information for transmission to the network.

Another object of the present invention to provide a compact unitary device that is capable of interfacing between a synchro and a small-scale computer (e.g., a PLC computer or an embedded computer) so that the device accepts input of digital information from the small-scale computer, converts the digital information to analog information suitable for the synchro, and outputs the analog information for transmission to the synchro.

It is a further object of the present invention to provide a compact unitary device that is capable of interfacing between a synchro and a network (which implements a present-day-standard communication protocol, e.g., DeviceNet) so that the device accepts input of digital information from the network, converts the digital information to analog information suitable for the synchro, and outputs the analog information for transmission to the synchro.

Typical inventive practice implements a computer for converting higher-level-format digital synchro data to lower-level-format parallel-binary-angle digital synchro data, and/or for converting lower-level-format parallel-binary-angle digital synchro data to higher-level-format digital synchro data. The higher-level-format digital synchro data is characterized by a higher-level data format than characterizes the lower-level-format parallel-binary-angle digital synchro data.

An inventive synchro-to-digital conversion unit, as typically embodied, includes synchro-to-digital conversion means and a computer. The synchro-to-digital conversion means serves to convert analog synchro data to lower-level-format parallel-binary-angle digital synchro data. The computer is configured to execute computer program logic that, when executed, is capable of converting the lower-level-format parallel-binary-angle digital synchro data to higher-level-format digital synchro data.

An inventive digital-to-synchro conversion unit, as typically embodied, includes digital-to-synchro conversion means and a computer. The computer is configured to execute computer program logic that, when executed, is capable of converting higher-level-format digital synchro data to lower-level-format parallel-binary-angle digital synchro data. The digital-to-synchro conversion means serves to convert the lower-level-format parallel-binary-angle digital synchro data to analog synchro data.

The present invention is typically embodied as a universal, compact, and easily reconfigurable converter unit, for performing conversion from synchro to digital and/or from digital to synchro. A typical inventive converter unit has a small form factor and is capable of: use as a stand-alone product; use as a slave in a multi-slave master-slave configuration; supporting multiple formats; effecting data communication between synchro systems and various modern computer systems and networks, including but not limited to personal computers (PCs), programmable logic controllers, embedded computers, and DeviceNet.

Described herein by way of example are inventive electronic modules referred to herein as "SSM" ("Synchro System Module") devices. The present invention's SSM device styled the "SSM-SD60" performs synchro-to-digital conversion. The present invention's SSM device styled the "SSM-DS60" performs digital-to-synchro conversion. Both inventive SSM devices afford functionality that is not afforded by conventional devices performing synchro-to-digital conversion or digital-to-synchro conversion.

Inventive SSM devices are typically designed to impart synchro conversion capabilities to modern computer systems and networks, e.g., PCs, and/or DeviceNet, and/or embedded computer devices, and/or programmable logic controllers (PLCs). It is to be understood that the SSM-SD60 and the SSM-DS60 units are representative of inventive prototypes and are merely exemplary of inventive practice, as the present invention admits of multifarious embodiments in performing synchro-to-digital conversion and/or digital-to-synchro conversion.

Both inventive SSM devices lend themselves to various configurations. An inventive SSM-SD60 or an inventive SSM-DS60 can be embodied to perform synchro conversion functions in either a closed-box configuration or an open-frame configuration. An inventive closed-box SSM device has inventive circuitry mounted inside an enclosure such as a rugged metal box, and is configured for use as a stand-alone unit that can be interfaced for instance to a computer, a PLC, or a fieldbus (e.g., a network on a DeviceNet data bus). An inventive open-frame SSM device has inventive circuitry mounted (and exposed) upon a basically planar frame, and is configured for being installed in a cabinet (for instance, in a Federal Government-owned input-output controller, or "Gov.-IOC"). Similarly as an inventive closed-box SSM device, an inventive open-frame SSM device can be interfaced to such items as a computer, a PLC, or a fieldbus.

According to current shipboard practice by the United States Navy, synchro navigation signals requiring conversion to digital navigation signals must be routed to a centrally located computer unit, such as an IOC (input-output controller) or a CCA (computer conversion assembly). In contrast, inventive practice as typified by the inventive synchro system module (SSM) is characterized by modular and small-scalable technology, and permits signal conversion on a more distributed (and hence more reliable) basis. In the event of a failure of an inventive SSM unit, fewer clients will be adversely affected, and other inventive SSM units in the distribution system can compensate for the singular malfunction.

Since synchro signals are legacy analog signals that traditionally have been used in military applications but not so much in commercial/industrial applications, the devices that have been developed for synchro conversion have been specialized and proprietary. The present invention avails itself of open-standard fieldbus technology, such as DeviceNet, as a propitious vehicle for transforming an unconventional conversion interface into a format that is widely accepted in industrial automation, thus allowing easy integration of dedicated synchro conversion devices into modern systems.

The following publications are informative on various electronic and networking standards and protocols: Common Industrial Protocol (CIP) Networks Library, Volume 1, CIP Edition 3.3; Common Industrial Protocol (CIP) Networks Library, Volume 1, DeviceNet Edition 1.5; 0183 Standard for Interfacing Electronic Devices, Volume 2.30, National Maritime Electrical Association (NMEA).

Hereby incorporated herein by reference is the following paper, coauthored by the present inventor and disclosing some aspects of the present invention: Charles J. Hermann and Bartlomiej Kleczynski, "Implementing Open Architecture in Navigation and Steering Control Systems," presented at the Automation and Controls 2010 Proceedings of the American Society of Naval Engineers (ASNE), 10-11 Aug. 2010, Milwaukee, Wis. Also incorporated herein by reference is the corresponding slideshow presentation at same conference, of same title, by same coauthors. The paper and the presentation are both available on the ASNE website, http://www.navalengineers.org.

Other objects, advantages, and features of the present invention will become apparent from the following detailed description of the present invention when considered in conjunction with the accompanying drawings.

BRIEF DESCRIPTION OF THE DRAWINGS

The present invention will now be described, by way of example, with reference to the accompanying drawings, wherein:

FIG. 4 and FIG. 9 are similar diagrams that essentially are reverse-direction counterparts of each other.

DESCRIPTION OF EXEMPLARY EMBODIMENTS OF THE INVENTION

Referring now to FIG. 1 through FIG. 4, the present invention's SSM-SD60 device's printed circuit board assembly (PCBA) 101 includes two industry-standard parallel synchro-to-digital converters 21 (viz., 21a and 21b), a computer program port 24, a microcontroller clock 25, a computer 30 (e.g., a microcontroller or microprocessor, including a processor 31 and a memory 32), a power supply 40, four connectors (viz., an RS 422 serial connector 51, a synchro input connector 56, a status LED connector 58, and a DeviceNet connector 59), a CAN transceiver 61, an RS-422 serial transceiver 62, configuration dipswitches 73, reverse-voltage protection elements 75, and a printed circuit board (PCB) 80. The inventive SSM-SD60 unit includes inventive PCBA 101 and a frame 90. The entire inventive PCBA 101 is housed by (e.g., mounted or otherwise secured in or on) frame 90, which can be characterized by a closed (fully enclosing) form such as exemplified by FIG. 2, or an open (plate-like or partially enclosing) form such as exemplified by FIG. 3.

The inventive SSM-SD60 circuitry is designed to convert 60 hz or 400 hz synchro inputs to either a DeviceNet data stream on CAN (Controller Area Network), or an NMEA (National Maritime Electrical Association) 0812 message on RS-422 serial. In other words, the inventive SSM-SD60 synchro-to-digital conversion unit serves as a single and comprehensive analog-to-digital conversion interface between a synchro and a present-day digital-data collection system. Although the inventive SSM-SD60 unit described herein is designed to operate in 60 hz or 400 hz frequencies, inventive practice of synchro-to-digital conversion is possible in various electrical frequencies.

Figure 1:
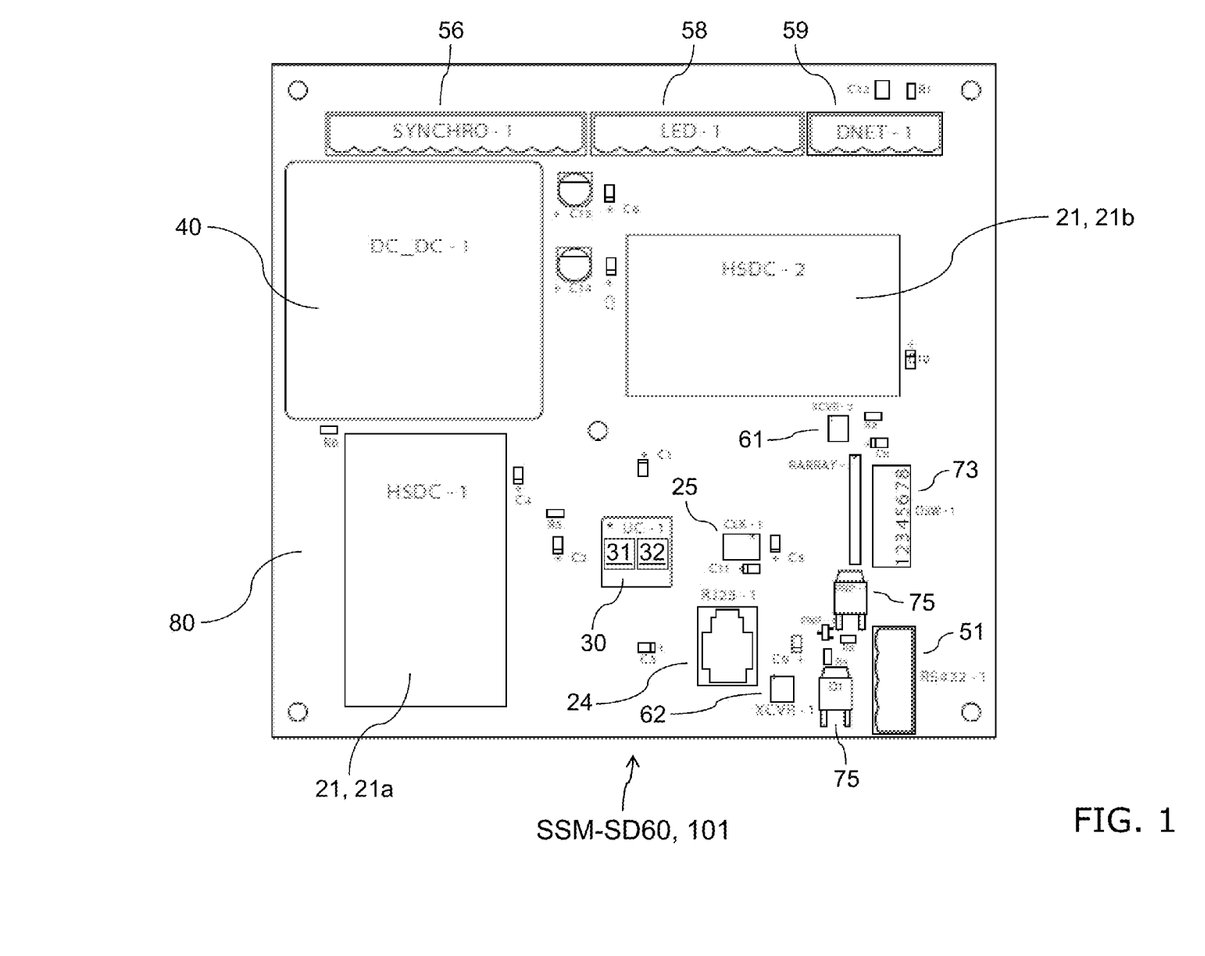
FIG. 1 is a circuit board schematic of an embodiment of an "SSM-SD60" synchro-to-digital conversion unit in accordance with the present invention.
Figure 2:
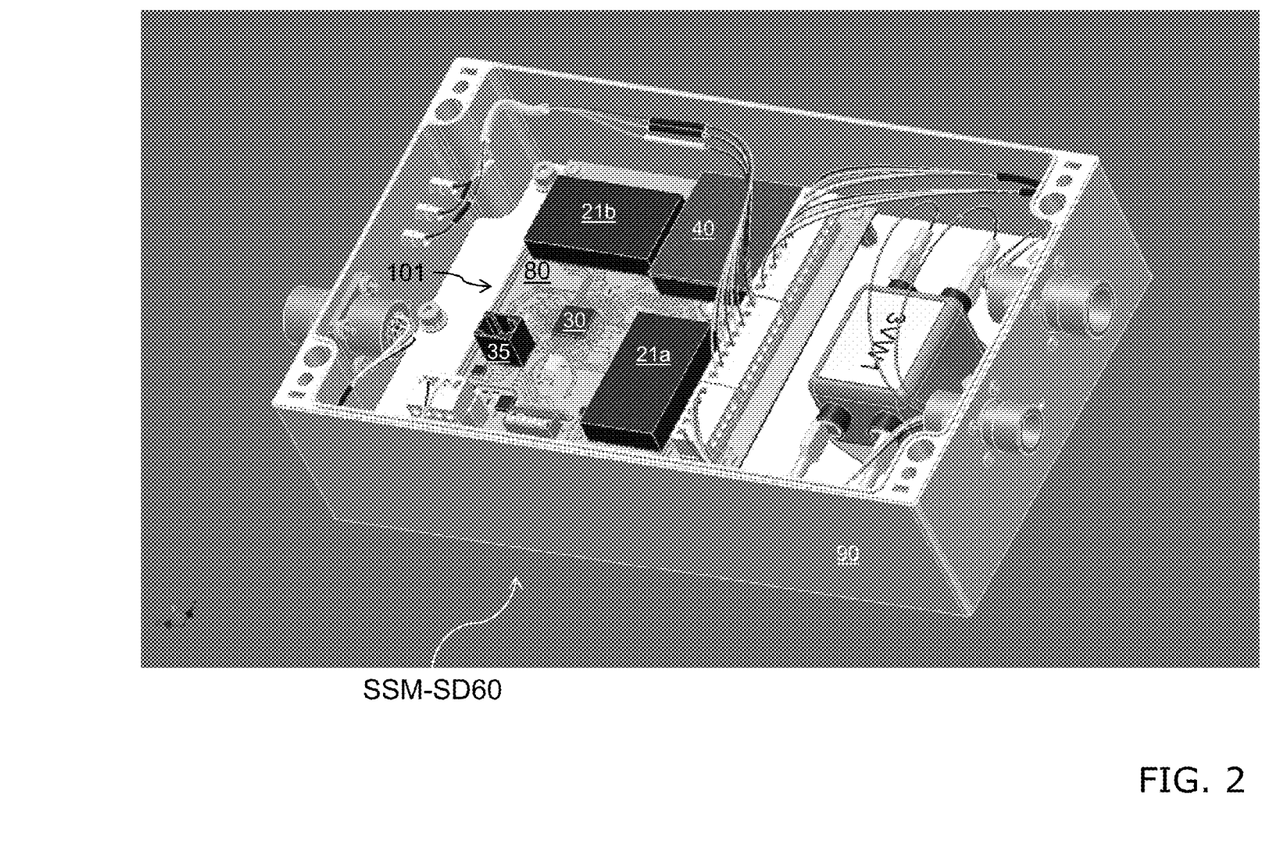
FIG. 2 is a perspective (internal) view of a closed-frame embodiment of an inventive SSM-SD60 synchro-to-digital conversion unit having a circuit board assembly similar to that shown in FIG. 1.
Figure 3:
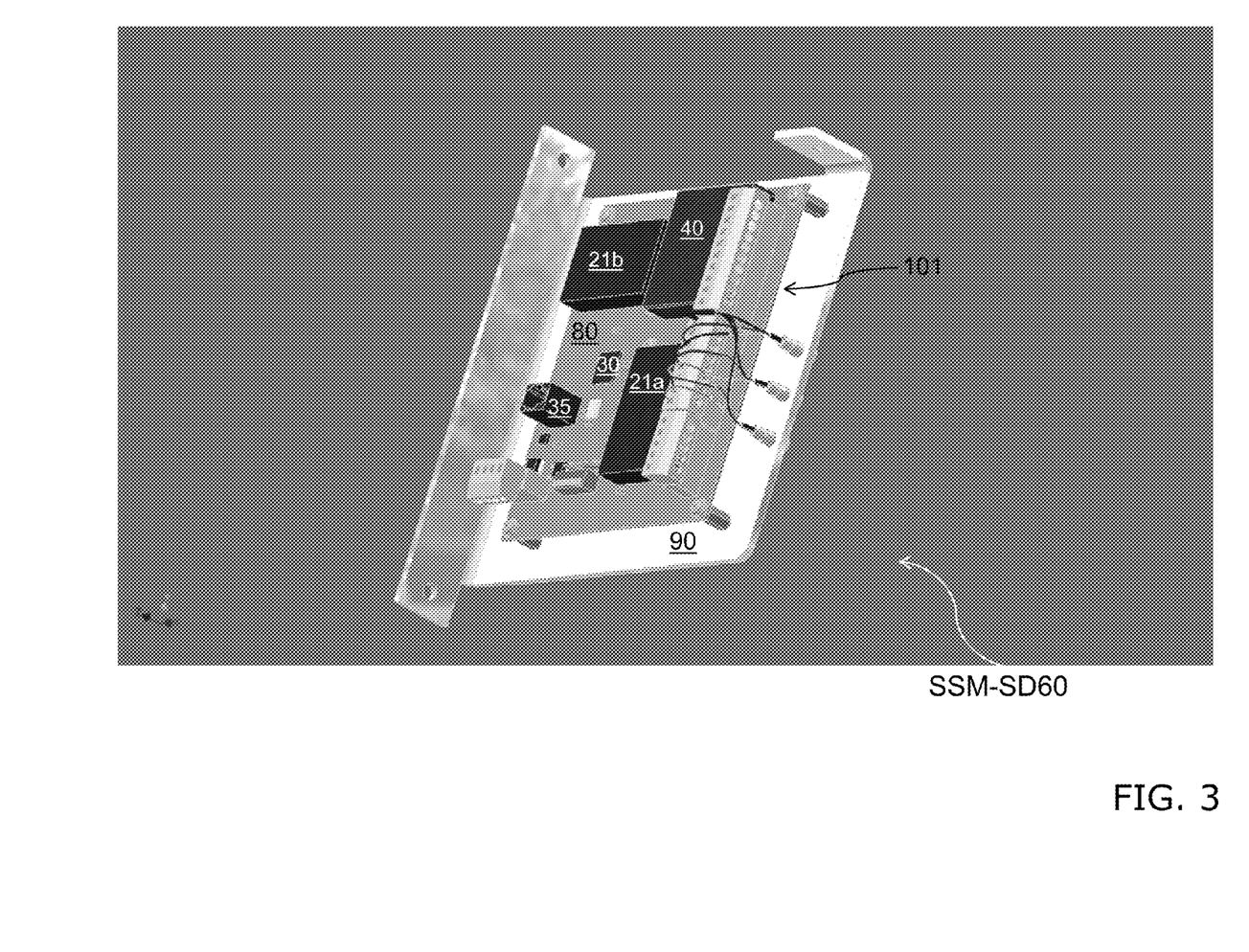
FIG. 3 is a perspective view of an open-frame embodiment of an inventive SSM-SD60 synchro-to-digital conversion unit having a circuit board assembly similar to that shown in FIG. 1.
Figure 4:
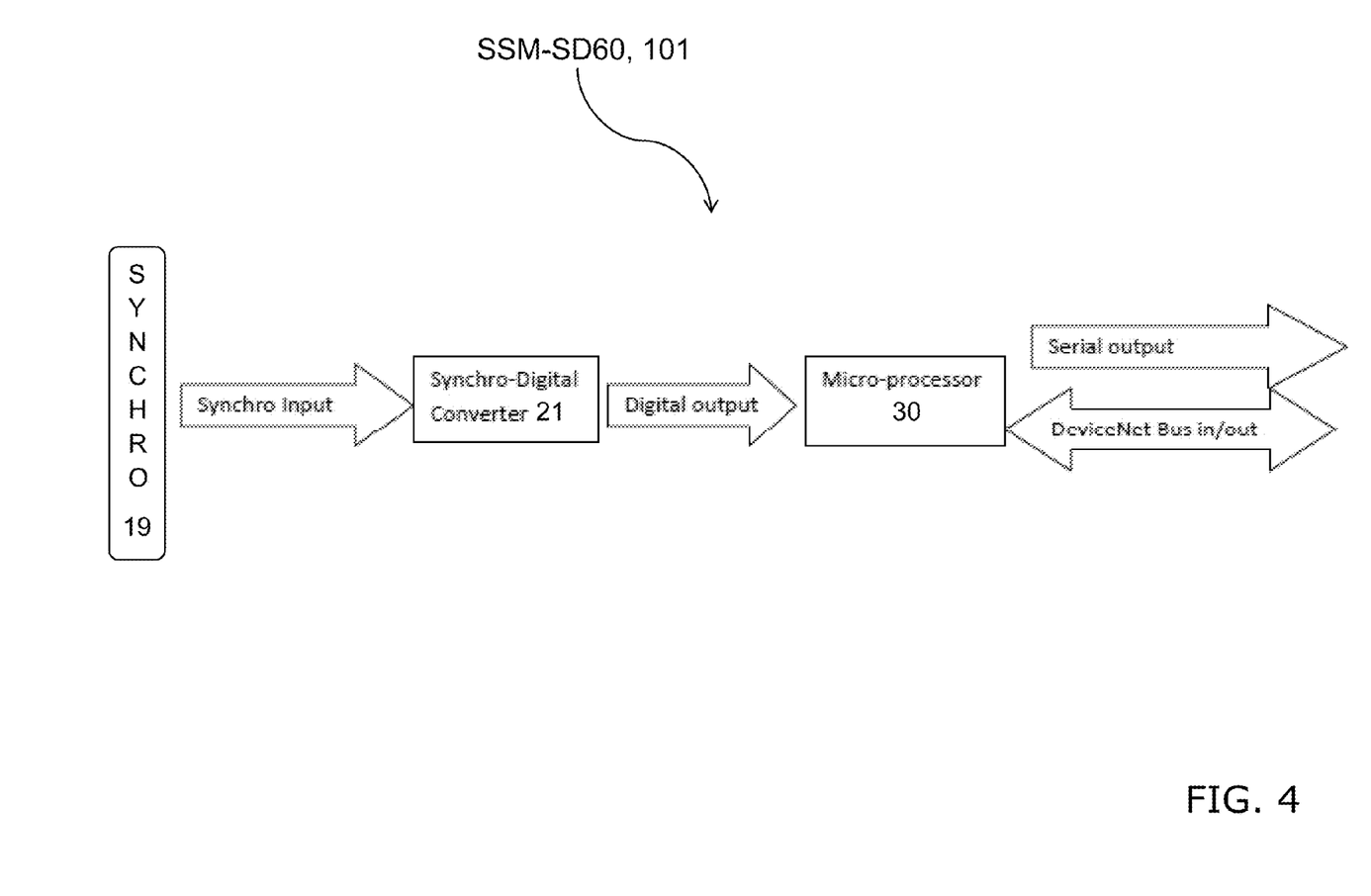
FIG. 4 is a functional block diagram of an embodiment of an inventive SSM-SD60 synchro-to-digital conversion unit such as shown in FIG. 1, FIG. 2, or FIG. 3.

As depicted in FIG. 4, synchro 19 (the synchro associated with the inventive SSM-SD60 device) inputs analog signals into at least one synchro-to-digital 21 converter component of the inventive SSM-SD60 device, i.e., into either synchro-to-digital converter 21a, or synchro-to-digital converter 21b, or both synchro-to-digital converter 21a and synchro-to-digital converter 21b. Each synchro-to-digital 21 converter component is a conventional (e.g., commercially available) synchro-to-digital conversion device. The digital data that is output by conventional synchro-to-digital conversion apparatus such as converters 21 is limited in its usefulness insofar as lacking compatibility or comprehensibility with respect to many modern computer devices, systems, and networks. Although two industry-standard parallel synchro-to-digital converters 21 are shown in FIG. 1 through FIG. 3, inventive practice of synchro-to-digital conversion is possible implementing conventional synchro-to-digital conversion means that includes one or practically any plural number of conventional synchro-to-digital conversion devices.

The digital output from the synchro-to-digital converter component(s) 21 is received and inventively processed by microprocessor 30, which has, resident in a nonvolatile portion of its memory 32, an inventive computer program product available for execution by its processor 31. Microprocessor 30 takes the digital information that is the product of conventional conversion from synchro to digital (performed by the synchro-to-digital converter component/components 21), and further converts that digital input into digital output that is suitably formulated for selected high-tech digital usage(s).

The inventive SSM-SD60 unit's microcontroller 30 packages the BAM (binary angle message) into the appropriate format and outputs digital signals. Microcontroller 30 also performs the function of setting various configuration settings as defined by the DeviceNet electronic datasheet (EDS) applicable to the inventive SSM-SD60 device. As shown in FIG. 4, microprocessor 30 outputs its data, which is the product of inventive conversion from "old digital data" to "new digital data," as either a serial output or a network (e.g., DeviceNet) output. According to some inventive embodiments, microprocessor 30 can also receive input from a network such as DeviceNet. According to typical inventive practice of synchro-to-digital signal conversion, all of the functional phases illustrated in FIG. 4 are performed by a single inventive unit such as the inventive SSM-SD60 module.

Figure 5:
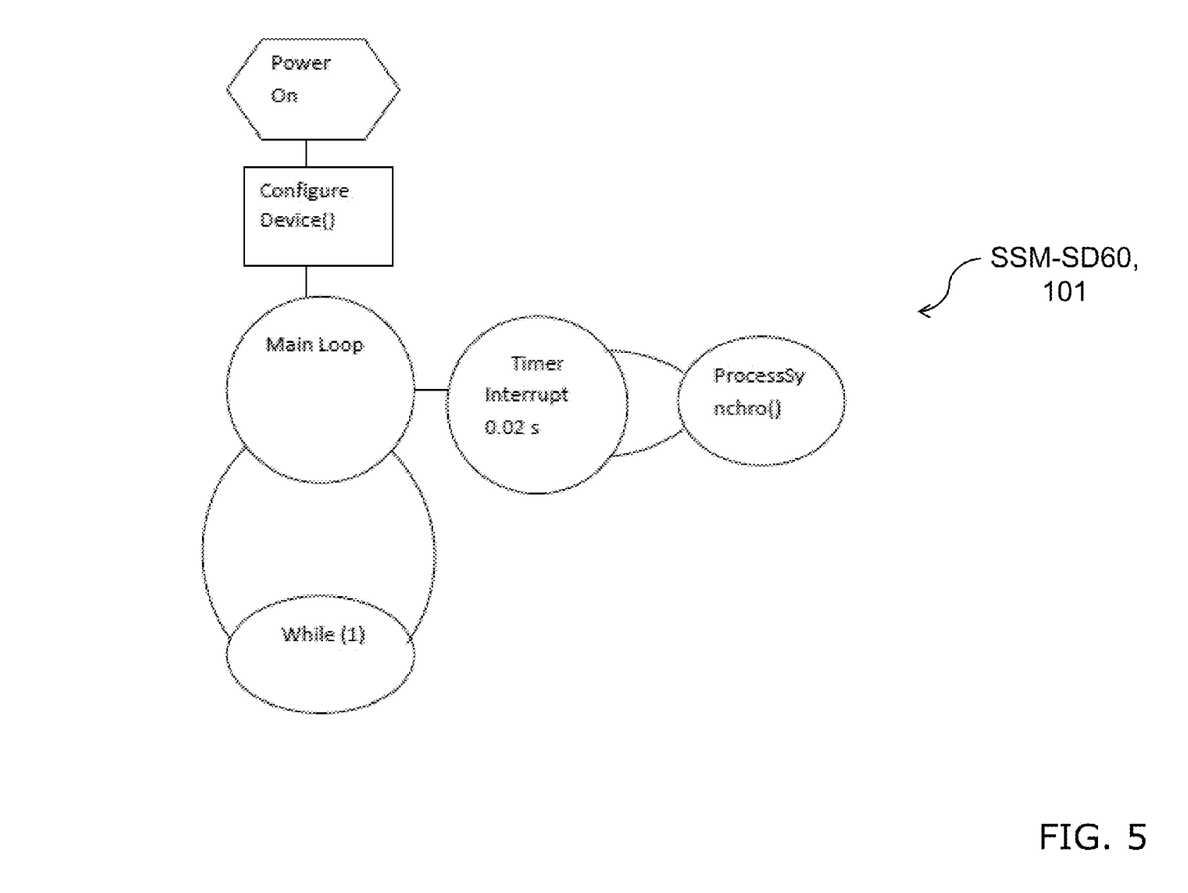
FIG. 5 is a flow diagram of exemplary computer program logic for a "serial" application of an inventive SSM-SD60 synchro-to-digital conversion unit such as shown in FIG. 1, FIG. 2, or FIG. 3.
Figure 6:
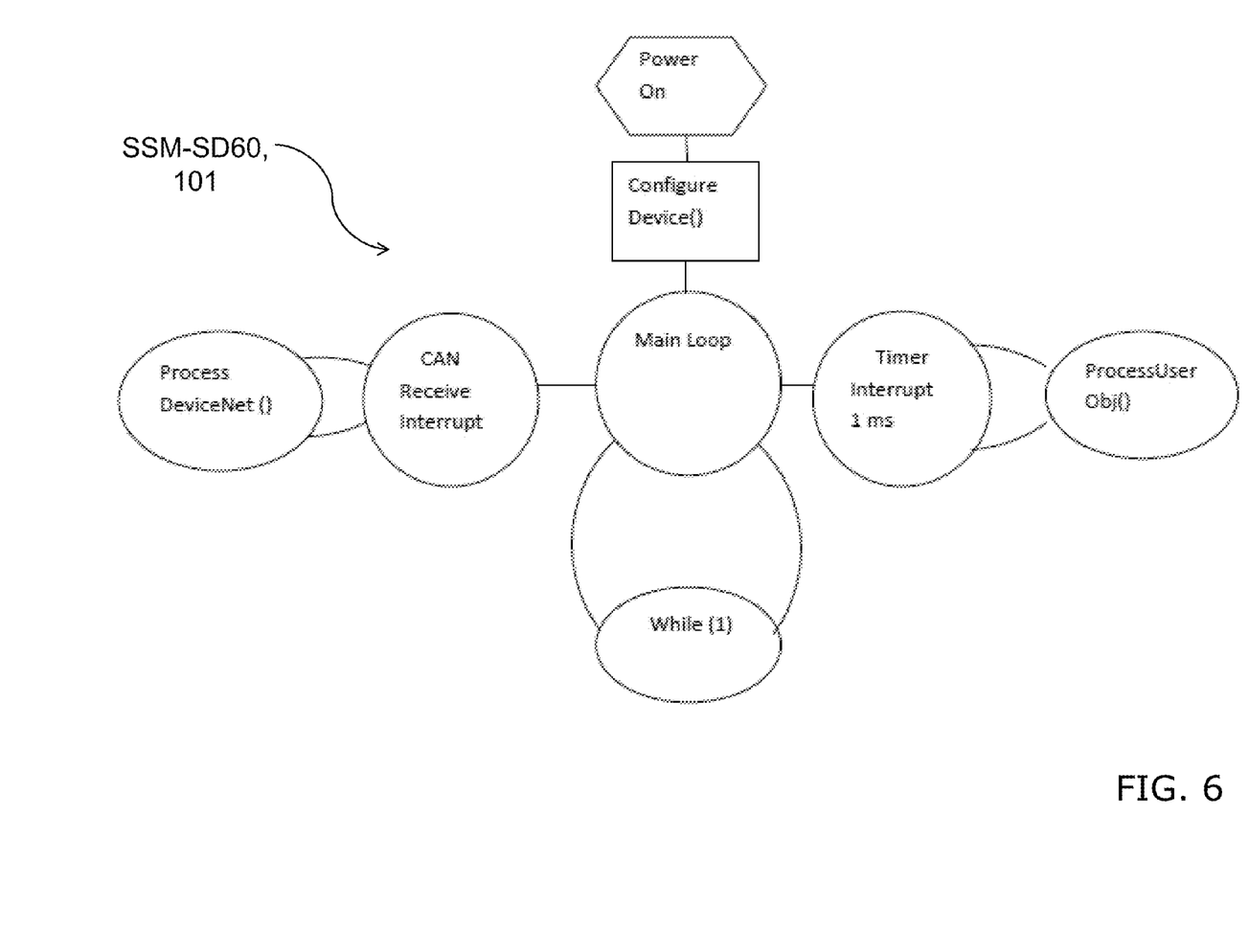
FIG. 6 is a flow diagram of exemplary computer program logic for a "DeviceNet" application of an inventive SSM-SD60 synchro-to-digital conversion unit such as shown in FIG. 1, FIG. 2, or FIG. 3.
Figure 10:
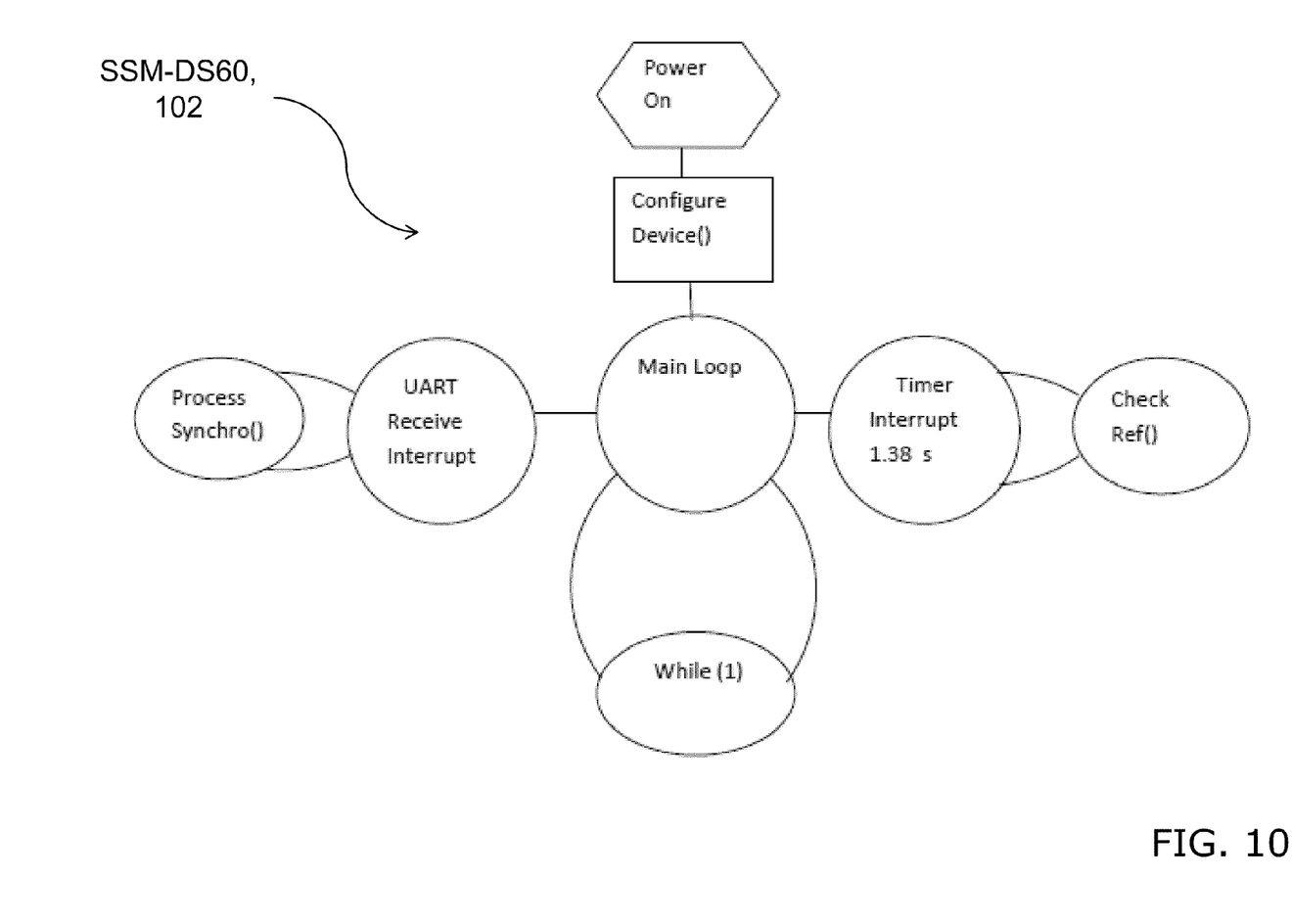
FIG. 10 is a flow diagram of exemplary computer program logic for a "serial" application of an inventive SSM-DS60 digital-to-synchro conversion unit such as shown in FIG. 7 or FIG. 8.
Figure 11:
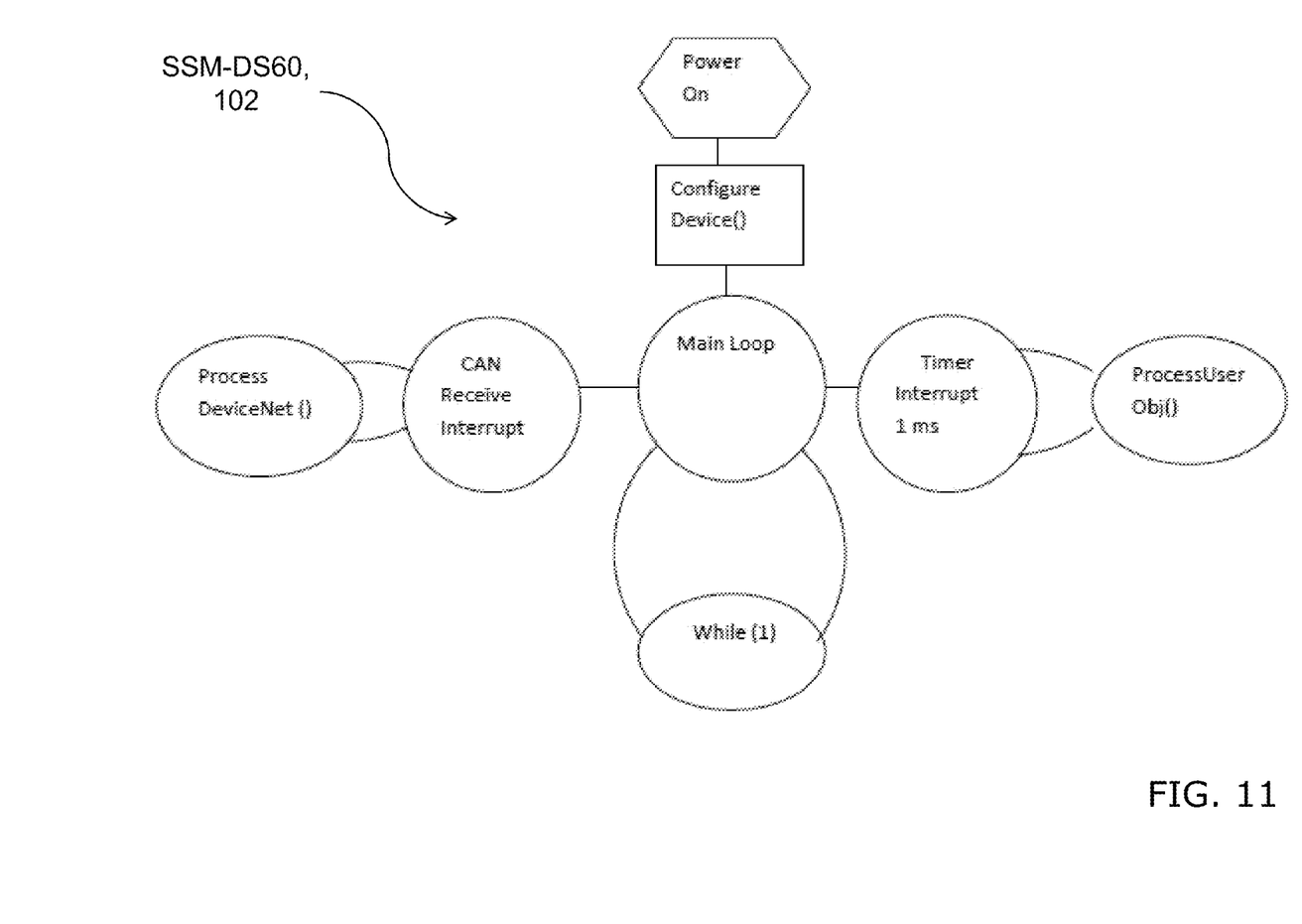
FIG. 11 is a flow diagram of exemplary computer program logic for a "DeviceNet" application of an inventive SSM-DS60 digital-to-synchro conversion unit such as shown in FIG. 7 or FIG. 8.

Reference is now made to FIG. 5 and FIG. 6, which are counterparts to FIG. 10 and FIG. 11, respectively. FIG. 5 shows the SSM-SD60 (synchro-to-digital) serial program flow; FIG. 10 shows the SSM-DS60 (digital-to-synchro) serial program flow. The inventive SSM-SD60 serial program (FIG. 5) and the inventive SSM-DS60 serial program (FIG. 10) are essentially the reverse of each other. FIG. 6 shows the SSM-SD60 (synchro-to-digital) DeviceNet program flow; FIG. 11 shows the SSM-DS60 (digital-to-synchro) DeviceNet program flow. The inventive SSM-SD60 DeviceNet program (FIG. 6) and the inventive SSM-DS60 DeviceNet program (FIG. 11) are essentially the reverse of each other.

As shown in FIG. 5, according to the inventive SSM-SD60 serial program, two channels of 90 v. 60 Hz synchro or 400 Hz synchro are converted to parallel digital in the binary angle format using synchro-to-digital capability 21 such as industry-standard synchro modules 21a and 21b. A computer such as microcontroller 30 reads the IO pins on synchro modules 21a and 21b at user-set intervals (periods), which drives a timer-interrupt. This interval is set by a rotary dipswitch 73 on the PCB 80. On power-up, the dipswitches 73 are read, and timers (e.g., microcontroller clock 25) and IO synchro modules (e.g., synchro modules 21a and 21b) are appropriately configured.

Still referring to FIG. 5, the inventive SSM-SD60 unit goes into a forever-loop, waiting for timer-interrupts. On each interrupt, the IO pins from the synchro-to-digital modules 21a and 21b are read in binary angle message (BAM) format, and are converted into floating point values using the following formula: (BAM data*360)/65535. An NMEA (National Maritime Electrical Association) message of the XDR (External Data Representation) format is constructed as follows: $YXXDR,A,xx.xx,D, CH_1, A,xx.xx,D,CH_2*hh<CR><LF>. This message is transmitted in RS-422 format on the inventive SSM-SD60 unit's serial port 51.

As shown in FIG. 6, the inventive SSM-SD60 DeviceNet program utilizes an ODVA (Open DeviceNet Vendor Association) compliant protocol stack to mediate the high-level DeviceNet communications. The inventive SSM-SD60 unit functions as a DeviceNet "slave." The terms "master" and "slave" are commonly used in the electromechanical arts to describe a relationship between a controlling device ("master") and a responding device ("slave"). Two channels of 90 v. 60 Hz synchro or 400 Hz synchro are converted to parallel digital in the binary angle format (Binary Angle Message, or BAM) using synchro-to-digital capability 21 such as industry-standard synchro modules 21a and 21b.

Still referring to FIG. 6, microcontroller 30 reads the IO pins of synchro-to-digital modules 21a and 21b, and populates a standard DeviceNet assembly object data structure with the data. There are also DeviceNet assembly objects used for configuration of the inventive SSM-SD60 unit. The inventive SSM-SD60 unit on power-up sets the microcontroller 30 IO pins for correct operation, and configures the CAN (Controller Area Network) modules 61 and timer 25 interrupts for proper program operation.

The inventive program then performs a duplicate MAC address check and sets up DeviceNet communication connections according to the DeviceNet specification. The inventive SSM-SD60 unit then obtains configuration data from flash memory, and sets a function pointer to the required data-processing function based on retrieved configuration data. If any steps fail, the inventive SSM-SD60 unit sets a fatal error.

The inventive SSM-SD60 unit then is driven by a 1 ms timer-interrupt that calls the user object code, and a CAN-interrupt that causes the DeviceNet protocol stack to process the assembly object data. In accordance with the Process DeviceNet( ) CAN-interrupt, the DeviceNet assembly data is processed by the protocol stack, and is transmitted to the DeviceNet master using the polled data transmission method.

The following takes place in accordance with the ProcessUserObj( ) timer-interrupt. Every 1 ms, the timer-interrupt causes the processUserObj( ) function to be called. It processes the synchro values either in two channels of single-speed synchro, or in one channel of dual-speed synchro, based on the configuration data saved in flash memory. The data is sent from the inventive SSM-SD60 unit in the same binary angle format (BAM—binary angle message, a 16-bit binary value representing 1-through-360 degrees) as it is received from the synchro-to-digital converters 21.

If the inventive SSM-SD60 unit is configured for two single channels, then the data is masked for whichever resolution the inventive SSM-SD60 unit is set for by DeviceNet configuration, and the data is populated in a standard DeviceNet assembly object to be transmitted to the master. If the inventive SSM-SD60 unit is configured for two-speed synchro, then the two channels of synchro data must be recombined into a single 32-bit value.

The pseudo-code for the ProcessUserObj( ) timer-interrupt is as follows:
Value=CH1(coarse)*RATIO
Error=CH2(fine)−CH1
Value+=Error
Turn=RATIO<<16
If (Value>=0x80000000) Value+=Turn
Else if (Value>=Turn) Value−=Turn The inventive SSM-SD60 unit's microcontroller 30 reads the IO pins of synchro-to-digital modules 21a and 21b, determines the state of the synchro reference signals, and sets the appropriate status bits in the DeviceNet IO assembly to be transmitted to the DeviceNet master. The data is then transmitted to the master according to the DeviceNet protocol, using the polled method of transmission.

Figure 7:
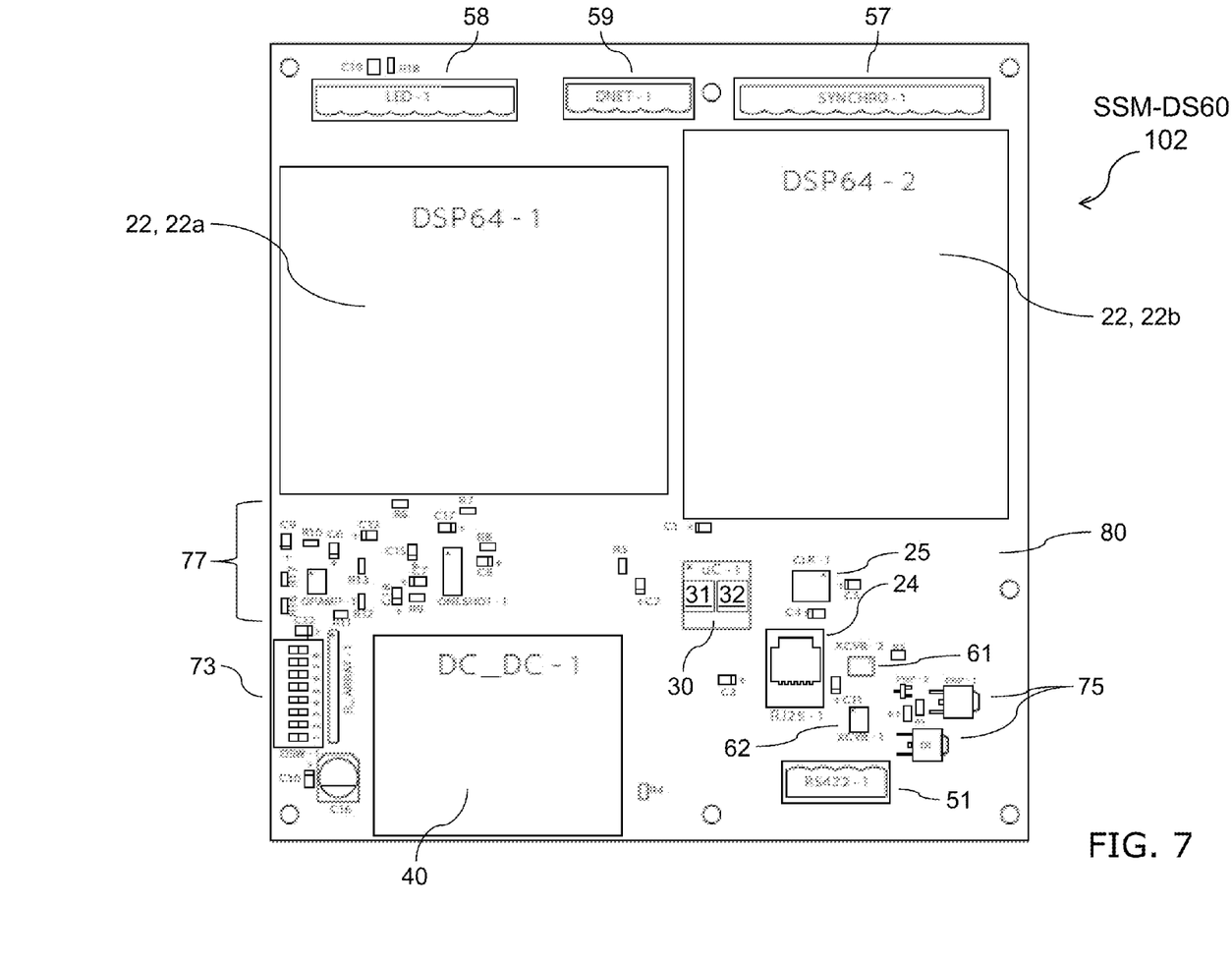
FIG. 7 is a circuit board schematic of an embodiment of a "SSM-DS60" digital-to-synchro conversion unit in accordance with the present invention.
Figure 8:
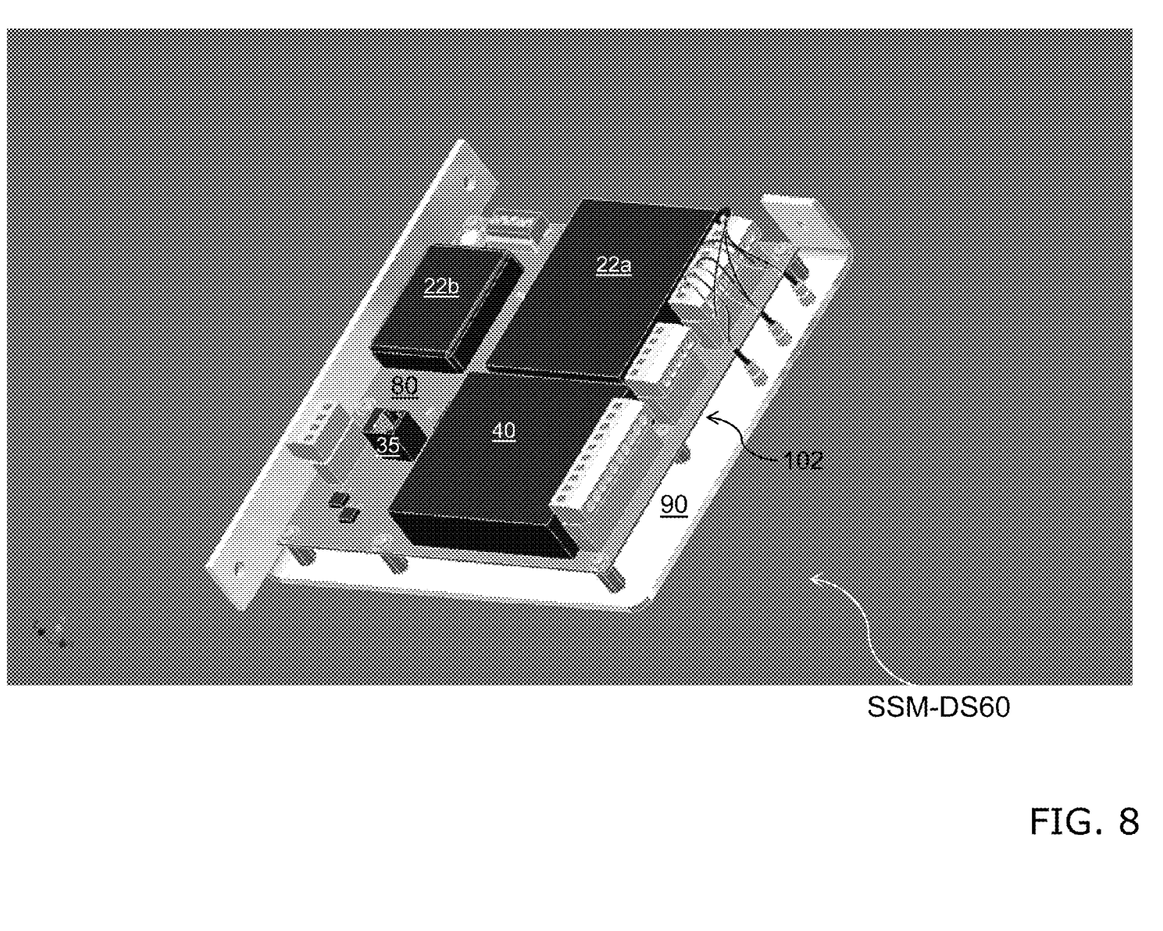
FIG. 8 is a perspective view of an open-frame embodiment of an inventive SSM-DS60 digital-to-synchro conversion unit having a circuit board assembly similar to that shown in FIG. 7.
Figure 9:
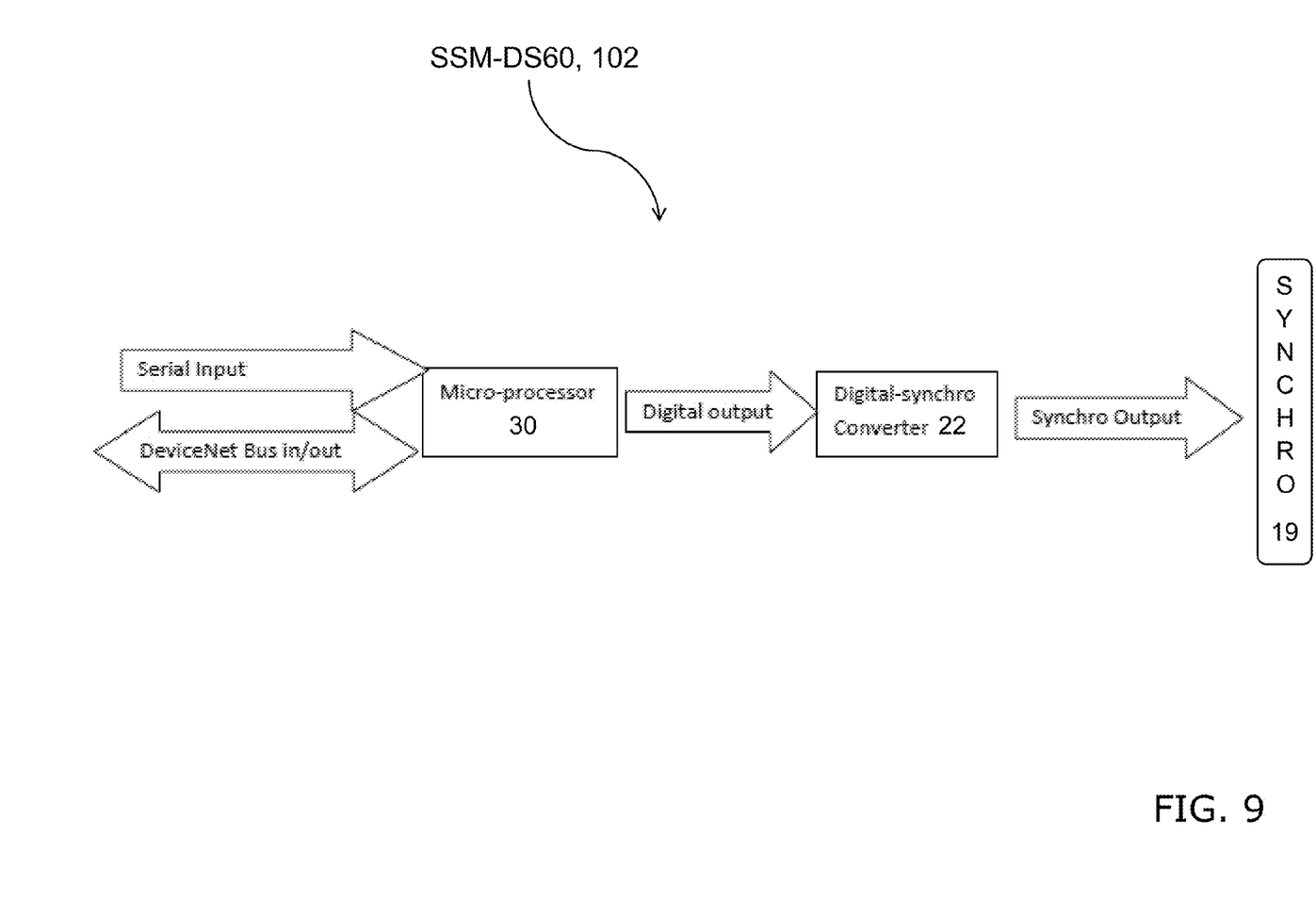
FIG. 9 is a functional block diagram of an embodiment of an inventive SSM-DS60 digital-to-synchro conversion unit such as shown in FIG. 8.

Now referring to FIG. 7 through FIG. 9, the present invention's SSM-DS60 digital-to-synchro conversion unit essentially performs the reverse function of the present invention's SSM-SD60 synchro-to-digital conversion unit. The inventive SSM-DS60 circuitry, exemplified in FIG. 7 and FIG. 8, is designed to convert 60 hz or 400 hz synchro outputs from either a DeviceNet data stream on CAN (Controller Area Network) or an NMEA (National Maritime Electrical Association) 0812 message on RS-422 serial. In other words, the inventive SSM-DS60 digital-to-synchro conversion unit serves as a single and comprehensive digital-to-analog conversion interface between a present-day digital-data collection system and a synchro. Although the inventive SSM-DS60 unit described herein is designed to operate in 60 hz or 400 hz frequencies, inventive practice of digital-to-synchro conversion is possible in various electrical frequencies.

The present invention's SSM-DS60 device's printed circuit board assembly (PCBA) 102 includes two industry-standard parallel digital-to-synchro converters 22 (viz., 22a and 22b), a computer program port 24, a microcontroller clock 25, a microcontroller 30 (including a processor 31 and a memory 32), a power supply 40, four connectors (viz., an RS 422 serial connector 51, a synchro output connector 57, a status LED connector 58, and a DeviceNet connector 59), a CAN transceiver 61, an RS-422 serial transceiver 62, configuration dipswitches 73, reverse-voltage protection elements 75, synchro reference detection circuit 77, and a printed circuit board (PCB) 80. The inventive SSM-DS60 unit includes inventive PCBA 102 and a frame 90. The entire inventive PCBA 102 is shown in FIG. 8 to be housed by an open frame 90 similar to the open frame 90 shown in FIG. 3. The ordinarily skilled artisan who reads this disclosure will appreciate that inventive practice can provide for housing of an inventive PCBA such as shown in FIG. 8 by a closed frame 90 such as shown in FIG. 2.

As depicted in FIG. 9, serial or network digital signals are input into microprocessor 30, which has, resident in a non-volatile portion of its memory 32, an inventive computer program product available for execution by its processor 31. Microprocessor 30 takes the digital information that it received from a computer or network (e.g., serial input or DeviceNet input), and converts that digital input into digital output that is suitably formulated for conventional conversion from digital to synchro as performed by either or both of the digital-to-synchro converter component/components 22. Each digital-to-synchro 22 converter component is a conventional (e.g., commercially available) digital-to-synchro conversion device. Analog data is output by conventional digital-to-synchro conversion apparatus for use by synchro 19 (the synchro associated with the inventive SSM-DS60 device). Although two industry-standard parallel digital-to-synchro converters 22 are shown in FIG. 7 and FIG. 8, inventive practice of digital-to-synchrol conversion is possible implementing conventional digital-to-synchro conversion means that includes one or practically any plural number of conventional synchro-to-digital conversion devices.

The inventive SSM-DS60 unit's microcontroller 30 reads the BAM (binary angle message) from the appropriate format and outputs digital signals. Microcontroller 30 also performs the function of setting various configuration settings as defined by the DeviceNet electronic datasheet (EDS) applicable to the inventive SSM-DS60 device. According to some inventive embodiments, microprocessor 30 can also transmit output to a network such as DeviceNet. According to typical inventive practice of digital-to-synchro signal conversion, all of the functional phases illustrated in FIG. 9 are performed by a single inventive unit such as the inventive SSM-DS60 module.

Reference is now made to FIG. 10 and FIG. 11, which represent exemplary variations of inventive digital-to-synchro conversion. FIG. 10 illustrates the SSM-DS60 (digital-to-synchro) serial program flow. FIG. 11 illustrates the SSM-DS60 (digital-to-synchro) DeviceNet program flow. As previously noted herein, FIG. 10 is reverse-counterpart to FIG. 5, and FIG. 11 is reverse-counterpart to FIG. 6.

As shown in FIG. 10, in accordance with the inventive SSM-DS60 serial program, the inventive SSM-DS60 receives a serial NMEA 0183 message of the type XDR, as follows: $YXXDR,A,xx.xx,D, CH_1, A,xx.xx,D,CH_2*hh<CR><LF>. This serial NMEA 0183 message encodes two channels of synchro data according to the NMEA 0183 Specification. The inventive computer program on power-up initializes the microcontroller 30 registers, and sets up all of the timer-interrupts and UART-interrupts. The inventive program then goes into an endless loop waiting for either a timer-interrupt or a UART-interrupt, signaling a new serial message. The inventive program at this point is entirely interrupt-driven.

The timer-interrupt is set to fire every 1.38 seconds. The analog reference output from digital-to-synchro converters 22a and 22b is processed by specialized circuitry on the PCB 80, viz., reference detection circuit 77, which converts the analog signals to a digital input to the microcontroller 30. The Check Ref( ) function reads the IO pins and determines the state of the synchro reference signals, and outputs a serial error message on the debug port if synchro reference is lost.

The UART receive-interrupt signals new data on the serial port. The Process Synchro( ) function verifies the NMEA checksum, parses the XDR message and extracts the CH1 1 and CH2 angles. These values are converted to binary angle format by the following formula: angle value *65535/360. This 16-bit value is masked on the two least significant bits and output on digital output pins of the microcontroller 30 connected to the digital-to-synchro modules 22a and 22b.

As shown in FIG. 11, the inventive SSM-DS60 DeviceNet program utilizes an ODVA (Open DeviceNet Vendor Association) compliant protocol stack to mediate the high-level DeviceNet communications. The user code receives the synchro command data as a standard DeviceNet assembly object. There are also DeviceNet assembly objects used for configuration of the unit. The inventive SSM-DS60 unit on power-up sets the microcontroller 30 IO pins for correct operation, and configures the CAN (Controller Area Network) modules 61 and timer 25 interrupts for proper program operation.

The inventive program then performs a duplicate MAC address check, and sets up DeviceNet communication connections according to the DeviceNet specification. The inventive SSM-DS60 unit then obtains configuration data from flash memory, and sets a function pointer to the required data-processing function based on retrieved configuration data. If any steps fail, the inventive SSM-DS60 unit sets a fatal error. The inventive SSM-DS60 unit then is driven by a 1 ms timer-interrupt that calls the user object code, and a CAN-interrupt that causes the DeviceNet protocol stack to process the assembly object data. According to the Process DeviceNet( ) CAN-interrupt, the DeviceNet assembly data is processed by the protocol stack and is placed into data structures to be used by the user code.

Still referring to FIG. 11, according to the ProcessUserObj( ) timer-interrupt, every 1 ms the timer-interrupt causes the processUserObj( ) function to be called. It processes the synchro values either in two channels of single-speed synchro, or in one channel of dual-speed synchro, based on the configuration data saved in flash memory. The data sent to the inventive SSM-DS60 unit is already in binary angle format (BAM—binary angle message, a 16-bit binary value representing 1-through-360 degrees).

If the inventive SSM-DS60 unit is configured for two single channels, then the data is masked for 14 bits (the two least significant bits are masked), and the digital outputs to the digital-to-synchro conversion modules 22 are set. If the inventive SSM-DS60 unit is configured for two-speed synchro, then the channel 2 data is multiplied by the 36× value, the data is masked for 14 bits, and the digital outputs to the digital-to-synchro converter modules 22 are set. The inventive SSM-DS60 unit reads the IO pins, determines the state of the synchro reference signals, and sets the appropriate status bits in the DeviceNet IO assembly to be transmitted back to the DeviceNet master.

Figure 12:
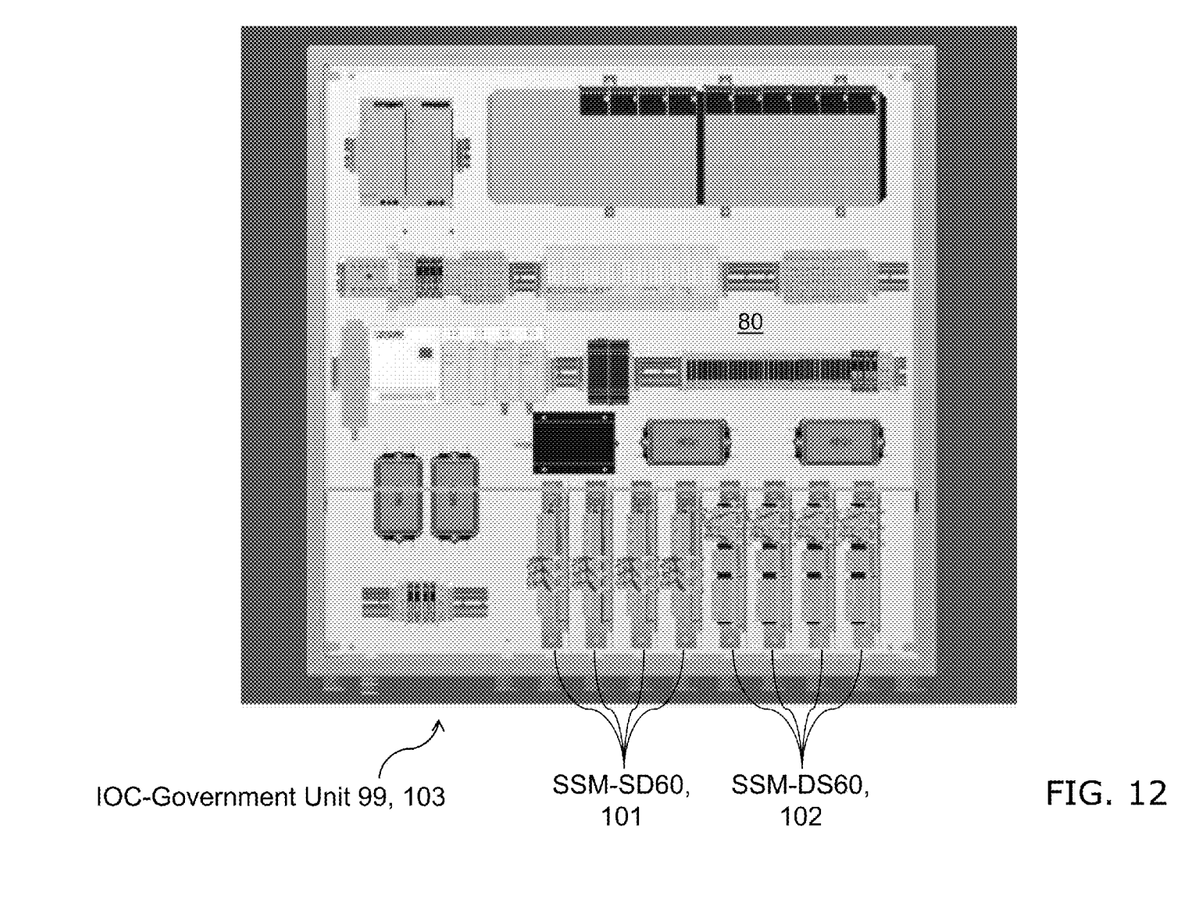
FIG. 12 is a top plan view of the interior of a multifunctional modular unit, viz., the Gov.-IOC input-output controller, that (by way of example) has been inventively adapted to include four inventive open-frame SSM-SD60 synchro-to-digital conversion units and four inventive open-frame SSM-DS60 digital-to-synchro conversion units.

With reference to FIG. 12, the present invention can be practiced in such a manner that an inventive electronic conversion PCBA or module is made part of a larger electronic system or module. An example of this kind of inventive practice is represented by association of one or more inventive SSM conversion PCBAs/units with the IOC-Government unit, a Federal Government-owned input-output controller unit. As shown in FIG. 12, inventively adapted IOC-Government unit 99 (or inventively adapted IOC-Government unit 99's PCBA 103) includes four inventive open-frame SSM-SD60 synchro-to-digital conversion units (or four inventive synchro-to-digital conversion PCBAs 101) and four inventive open-frame SSM-DS60 digital-to-synchro conversion units (or four inventive digital-to-synchro conversion PCBAs 102).

The present inventor is developing an inventive SSM unit referred to herein as the "SSM v3," which incorporates characteristics of the inventive SSM-SD60 unit and the SSM-DS60 unit, and which is designed to be more multifunctional than either the inventive SSM-SD60 unit or the inventive SSM-DS60 unit. The inventive SSM v3 unit, not shown herein, is exemplary of a single inventive converter unit that is capable of affording "bidirectionality" in terms of synchro-to-digital conversion and digital-to-synchro conversion, such as by combining the inventive functions illustrated in FIG. 4 (synchro-to-digital) and FIG. 9 (digital-to-synchro). The inventive SSM v3 unit A version 3 SSM will include support for Ethernet and additional protocols such as Profibus and Ethernet/IP, and support for either single-speed synchro signals or multispeed synchro signals.

The inventive SSM v3 unit will have a master controller board that includes: a microprocessor; two Ethernet ports for network connectivity; a CAN controller; a CAN interface for DeviceNet connectivity; a Profibus interface controller; an RS-422 interface for serial communications; daughter cards; and, an I2C ("I Squared C") connection for the daughter cards. The daughter cards will permit the same main controller board to be interfaced with conventional synchro-to-digital converters (such as synchro-to-digital converters 21), conventional digital-to-synchro converters (such as digital-to-synchro converters 22), and/or "amplified" conventional digital-to-synchro converters. The inventive SSM v3 unit is intended to facilitate conversion, in either or both directions (i.e., synchro-to-digital and digital-to-synchro), between synchro signals and all of the high-level communication protocols commonly used by the U.S. Navy.

The present invention, which is disclosed herein, is not to be limited by the embodiments described or illustrated herein, which are given by way of example and not of limitation. Other embodiments of the present invention will be apparent to those skilled in the art from a consideration of the instant disclosure, or from practice of the present invention. Various omissions, modifications, and changes to the principles disclosed herein may be made by one skilled in the art without departing from the true scope and spirit of the present invention, which is indicated by the following claims.

What is claimed is:

1. A synchro-to-digital conversion unit comprising:
   synchro-to-digital conversion means, for converting analog synchro data to lower-level parallel-binary-angle digital synchro data; and
   a computer, configured to execute computer program logic that, when executed, is capable of converting said lower-level parallel-binary-angle digital synchro data to higher-level digital synchro data, said higher-level digital synchro data being characterized by a higher-level data format than said lower-level parallel-binary-angle digital synchro data.

2. The synchro-to-digital conversion unit of claim 1, wherein said synchro-to-digital conversion means includes at least one synchro-to-digital device.

3. The synchro-to-digital conversion unit of claim 1, wherein:
   said analog synchro data is output by a synchro and is input to said synchro-to-digital conversion means;
   said analog synchro data is converted by said synchro-to-digital conversion means to said lower-level parallel-binary-angle digital synchro data;
   said lower-level parallel-binary-angle digital synchro data is output by said synchro-to-digital conversion means and is input to said computer;
   said lower-level parallel-binary-angle digital synchro data is converted by said computer to said higher-level digital synchro data;
   said higher-level digital synchro data is output by said computer.

4. The synchro-to-digital conversion unit of claim 3, wherein the output said higher-level digital synchro data is input to at least one of a device, a system, and a network.

5. The synchro-to-digital conversion unit of claim 1, further comprising a power supply, for powering components of the synchro-to-digital conversion unit including said synchro-to-digital conversion means and said computer.

6. The synchro-to-digital conversion unit of claim 5, further comprising a printed circuit board and a frame, wherein components of the synchro-to-digital conversion unit including said synchro-to-digital conversion means, said computer, and said power supply are mounted on said printed circuit board so as to constitute, together with said printed circuit board, a printed circuit board assembly, and wherein said printed circuit board assembly is housed by said frame.

7. The synchro-to-digital conversion unit of claim 6, wherein:
   said analog synchro data is output by a synchro and is input to said synchro-to-digital conversion means;
   the input said analog synchro data is converted by said synchro-to-digital conversion means to said lower-level parallel-binary-angle digital synchro data;
   said lower-level parallel-binary-angle digital synchro data is output by said synchro-to-digital conversion means and is input to said computer;
   the input said lower-level parallel-binary-angle digital synchro data is converted by said computer to said higher-level digital synchro data;
   said higher-level digital synchro data is output by said computer.

8. The synchro-to-digital conversion unit of claim 7, wherein the output said higher-level digital synchro data is input to at least one of a device, a system, and a network.

9. A digital-to-synchro conversion unit comprising:
   a computer, configured to execute computer program logic that, when executed, is capable of converting higher-level digital synchro data to lower-level parallel-binary-angle digital synchro data, said higher-level digital synchro data being characterized by a higher-level data format than said lower-level parallel-binary-angle digital synchro data; and
   digital-to-synchro conversion means, for converting said lower-level parallel-binary-angle digital synchro data to analog synchro data.

10. The digital-to-synchro conversion unit of claim 9, wherein said digital-to-synchro conversion means includes at least one digital-to-synchro device.

11. The digital-to-synchro conversion unit of claim 9, wherein:
    said higher-level digital synchro data is output by at least one of a device, a system, and a network, and is input to said computer;
    the input said higher-level digital synchro data is converted by said computer to said lower-level parallel-binary-angle digital synchro data;
    said lower-level parallel-binary-angle digital synchro data is output by said computer and input to said digital-to-synchro conversion means;
    the input said lower-level parallel binary angle digital synchro data is converted by said digital-to-synchro conversion means to said analog synchro data;
    said analog synchro data is output by said digital-to-synchro conversion means.

12. The digital-to-synchro conversion unit of claim 11, wherein the output said analog synchro data is input to a synchro.

13. The digital-to-synchro conversion unit of claim 9, further comprising a power supply, for powering components of the digital-to-synchro conversion unit including said digital-to-synchro conversion means and said computer.

14. The digital-to-synchro conversion unit of claim 13, further comprising a printed circuit board and a frame, wherein components of the digital-to-synchro conversion unit including said digital-to-synchro conversion means, said computer, and said power supply are mounted on said printed circuit board so as to constitute, together with said printed circuit board, a printed circuit board assembly, and wherein said printed circuit board assembly is housed by said frame.

15. The digital-to-synchro conversion unit of claim 14, wherein:
    said higher-level digital synchro data is output by at least one of a digital device, a digital system, and a digital network, and is input to said computer;
    the input said higher-level digital synchro data is converted by said computer to said lower-level parallel-binary-angle digital synchro data;
    said lower-level parallel-binary-angle digital synchro data is output by said computer and input to said digital-to-synchro conversion means;
    the input said lower-level parallel binary angle digital synchro data is converted by said digital-to-synchro conversion means to said analog synchro data;
    said analog synchro data is output by said digital-to-synchro conversion means.

16. The digital-to-synchro conversion unit of claim 15, wherein the output said analog synchro data is input to a synchro.

17. A conversion unit, for converting synchro data to digital data or digital data to synchro data, the conversion unit comprising synchro-to-digital conversion means, digital-to-synchro conversion means, and a computer, wherein:

said synchro-to-digital conversion means receives analog synchro data from a synchro, and converts the received said analog synchro data to lower-level parallel-binary-angle digital synchro data;

said digital-to-synchro conversion means receives lower-level parallel-binary-angle digital synchro data from said computer, and converts the received said lower-level parallel-binary-angle digital synchro data to analog synchro data suitable for use by a synchro;

said computer receives lower-level parallel-binary-angle digital synchro data from said synchro-to-digital conversion means, and converts the received said lower-level parallel-binary-angle digital synchro data to higher-level digital synchro data suitable for use by at least one of a digital device, a digital system, and a digital network;

said computer receives higher-level digital synchro data from at least one of a digital device, a digital system, and a digital network, and converts the received said higher-level digital synchro data to lower-level parallel-binary-angle digital synchro data for receipt by said digital-to-synchro conversion means;

said higher-level digital synchro data is characterized by a higher-level data format than said lower-level parallel-binary-angle digital synchro data.

18. The conversion unit of claim 17, further comprising a power supply, a printed circuit board, and a frame, wherein:

the conversion unit comprises a printed circuit board assembly constituted by said printed circuit board and components mounted on said printed circuit board, said components including said synchro-to-digital conversion means, said digital-to-synchro conversion means, said computer, and said power supply;

said power supply powers components of the digital-to-synchro conversion unit including said synchro-to-digital conversion means, said digital-to-synchro conversion means, and said computer.

* * * * *